(12) United States Patent
Iwasaka et al.

(10) Patent No.: US 10,654,654 B2
(45) Date of Patent: May 19, 2020

(54) SUCTION DEVICE

(71) Applicant: HARMOTEC CO., LTD., Kofu, Yamanashi (JP)

(72) Inventors: Hitoshi Iwasaka, Kofu (JP); Hideyuki Tokunaga, Kofu (JP); Yuji Kasai, Kofu (JP)

(73) Assignee: HARMOTEC CO., LTD., Kofu (JP)

( * ) Notice: Subject to any disclaimer, the term of this patent is extended or adjusted under 35 U.S.C. 154(b) by 197 days.

(21) Appl. No.: 15/750,084

(22) PCT Filed: Jun. 30, 2016

(86) PCT No.: PCT/JP2016/069384
§ 371 (c)(1),
(2) Date: Feb. 2, 2018

(87) PCT Pub. No.: WO2017/026189
PCT Pub. Date: Feb. 16, 2017

(65) Prior Publication Data
US 2018/0222679 A1   Aug. 9, 2018

(30) Foreign Application Priority Data

Aug. 11, 2015   (JP) ................... 2015-159205

(51) Int. Cl.
*B65G 21/20*   (2006.01)
*A23L 5/10*   (2016.01)
(Continued)

(52) U.S. Cl.
CPC ............ *B65G 21/2027* (2013.01); *A23L 5/11* (2016.08); *A23L 5/20* (2016.08); *A23P 20/12* (2016.08);
(Continued)

(58) Field of Classification Search
CPC ............. B25J 15/0683; H01L 21/6838; B25B 11/005; B65G 21/2027; B65G 21/20;
(Continued)

(56) References Cited

U.S. PATENT DOCUMENTS 5,067,762 A * 11/1991 Akashi ................. B25J 15/0616
271/97
7,332,055 B2 * 2/2008 Orii .......................... B08B 3/02
118/730
(Continued)

FOREIGN PATENT DOCUMENTS

EP   1 722 410 A1   11/2006
JP   2005-051260 A   2/2005
(Continued)

OTHER PUBLICATIONS

Sep. 20, 2016 Written Opinion issued in International Patent Application No. PCT/JP2016/069384.
(Continued)

*Primary Examiner* — Joseph H Hail
*Assistant Examiner* — Robert C Moore
(74) *Attorney, Agent, or Firm* — Oliff PLC

(57) ABSTRACT

Suction device includes swirl flow-forming body that forms a swirl flow to apply suction to material by use of Bernoulli's principle, and case that houses swirl flow-forming body, and guides flow of a fluid flowing out of concave part of swirl flow-forming body. Case includes guide part, flange part, and cover part. Guide part controls flow of a fluid flowing out of concave part of swirl flow-forming body and flowing along end face, such that the fluid flows in a direction away from a position of material. Flange part forms, between flange part and end face, a flow path for a fluid to flow out of concave part. Cover part is fixed on the top surface of main body of swirl flow-forming body.

9 Claims, 10 Drawing Sheets

Figure 1:
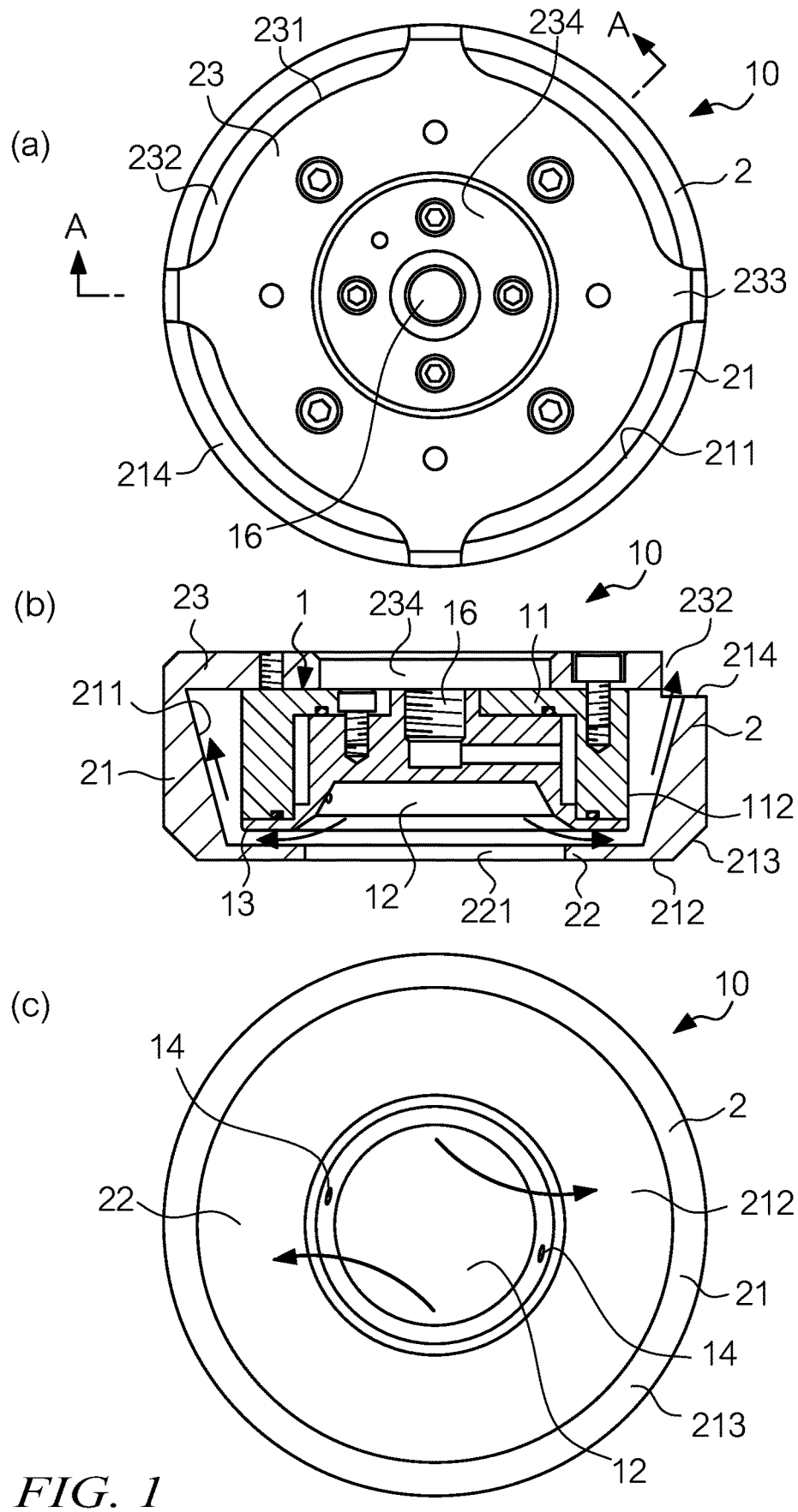

(51) Int. Cl.
*A23P 20/12* (2016.01)
*B25J 15/06* (2006.01)
*A23L 5/20* (2016.01)
*H01L 21/683* (2006.01)
*A47L 9/00* (2006.01)
*F04F 5/06* (2006.01)

(52) U.S. Cl.
CPC .......... *B25J 15/06* (2013.01); *H01L 21/6838* (2013.01); *A23V 2002/00* (2013.01); *A47L 9/0072* (2013.01); *F04F 5/06* (2013.01)

(58) Field of Classification Search
CPC . B65B 11/00; F04D 17/10; B23Q 3/08; A47L 9/02
USPC ............ 99/292, 452, 472; 294/64.3; 269/21; 118/500; 15/415.1, 421
See application file for complete search history.

(56) References Cited

U.S. PATENT DOCUMENTS

| | | | |
|---|---|---|---|
| 2003/0033728 A1 | 2/2003 | Iwasaka et al. | |
| 2008/0223412 A1* | 9/2008 | Lee | H01L 21/67051 134/33 |
| 2010/0089015 A1 | 4/2010 | Takayanagi | |
| 2013/0234194 A1* | 9/2013 | Ryu | B65G 47/911 257/99 |
| 2014/0082865 A1 | 3/2014 | Takayanagi | |
| 2014/0376146 A1 | 12/2014 | Takayanagi | |
| 2016/0288334 A1* | 10/2016 | Li | B65G 47/911 |

FOREIGN PATENT DOCUMENTS

| | | |
|---|---|---|
| JP | 2010-78487 A | 4/2010 |
| JP | 2010-88751 A | 4/2010 |
| JP | 2014-78491 A | 5/2014 |
| KR | 10-1439575 B1 | 9/2014 |
| WO | 2015/083613 A1 | 6/2015 |

OTHER PUBLICATIONS

Sep. 20, 2016 International Search Report issued in International Patent Application No. PCT/JP2016/069384.
Feb. 14, 2019 extended Search Report issued in European Patent Application No. 16834886.0.
Feb. 28, 2019 Office Action issued in Korean Patent Application No. 10-2018-7006339.
Sep. 2, 2019 Office Action issued in Chinese Patent Application No. 201680046153.7.

* cited by examiner

US 10,654,654 B2

SUCTION DEVICE

TECHNICAL FIELD

The present invention pertains to equipment that applies suction to a material by use of Bernoulli's principle.

BACKGROUND ART

In recent years, there has been developed equipment for non-contact conveyance of a plate-like member, such as a semiconductor wafer or a glass substrate. For example, in Patent Document 1, equipment is proposed for conveying a plate-like member in a non-contact manner, by applying Bernoulli's principle. The equipment includes a cylindrical chamber that opens on an underside of the equipment. Fluid is supplied into the chamber to generate a swirl flow having a central negative pressure, which exerts suction on the plate-like member. Fluid flowing out of the cylindrical chamber causes a given distance to be maintained between the equipment and the plate-like member, thereby enabling non-contact conveyance by the equipment of the plate-like member.

PRIOR ART DOCUMENT

Patent Document

Patent Document 1: JP 2005-51260 A1

SUMMARY OF THE INVENTION

Problems to be Solved by the Invention

The present invention has been made in view of the above technology, and has as its object provision of a suction device that is able to apply suction to a material in the form of a liquid or powder, while preventing dispersal of the material to which suction is applied.

Means for Solving the Problems

To solve the problem described above, the present invention provides a suction device, comprising: a columnar main body; a flat end face formed at the main body; a concave part formed at the end face; a fluid flow-forming means for forming a fluid swirl flow in the concave part or forming a radial flow by discharging fluid into the concave part, the fluid swirl flow or the radial flow generating negative pressure that applies suction to a material; and a guide part that surrounds the concave part, and controls flow of a fluid flowing out of the concave part and flowing along the end face, such that the fluid flows in a direction away from a position occupied by the material prior to commencement of suction.

In a preferred mode of the invention, the guide part is a cylindrical member that is arranged such that an opening edge of the cylindrical member projects toward the material relative to the end face.

In a further preferred mode of the invention, the suction device further comprises a flange part that is formed inwardly at the opening edge, the flange part comprising a surface that opposes the end face.

In a further preferred mode of the invention, an inner periphery of the guide part is tapered such that an inner diameter of the guide part reduces toward the opening edge, and the guide part guides the fluid flowing out of the concave part along the inner periphery.

In a further preferred mode of the invention, the guide part comprises a plate-like member that extends across another opening edge of the guide part, and the plate-like member is fixed on a surface opposite to the end face of the main body.

In another preferred mode of the invention, the guide part is made of plural members.

In a further preferred mode of the invention, the suction device further comprises a cylindrical container that surrounds an outer circumference of the guide part, the container comprising a bottom with a through hole, wherein the main body is arranged within the through hole such that the concave part opens toward the outside of the container.

In a further preferred mode of the invention, an inner periphery of the container is tapered such that an inner diameter of the container reduces toward the through hole.

In a further preferred mode of the invention, the material is food.

EFFECTS OF THE INVENTION

The present invention enables a suction device to apply suction to material in the form of liquid or powder, while preventing dispersal of the material to which suction is applied.

Figure 2:
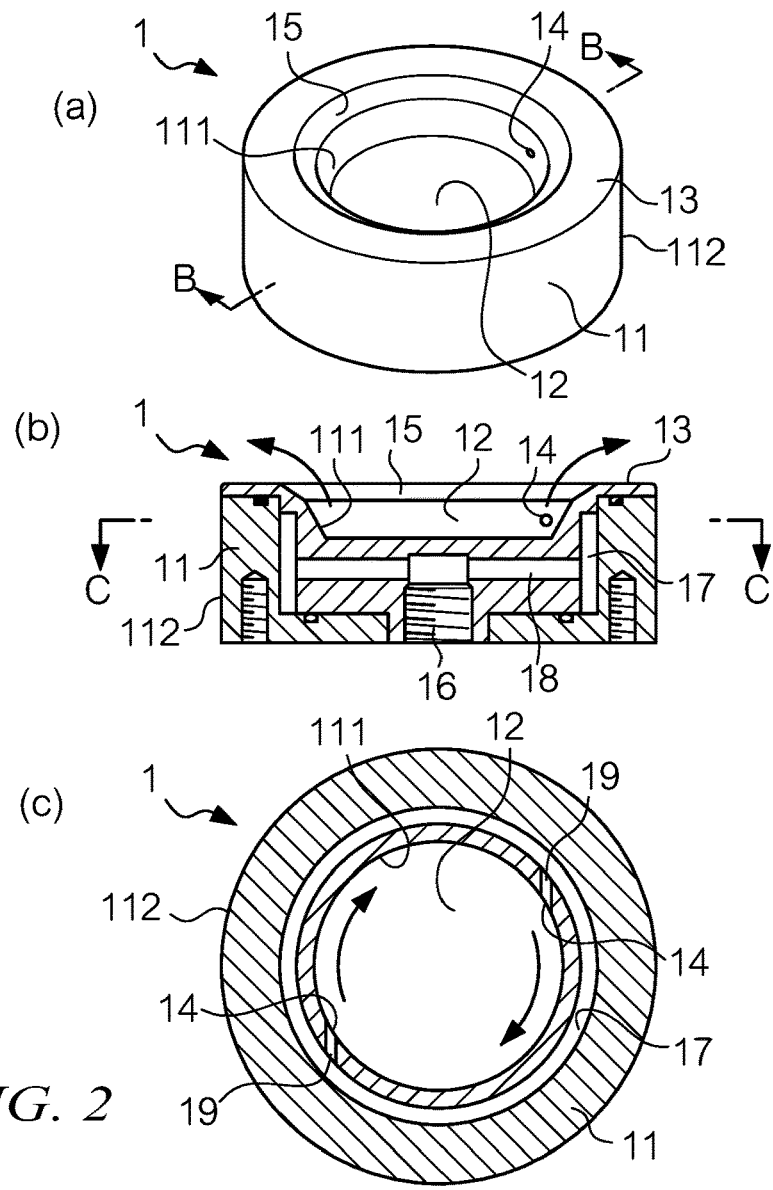
Figure 3:
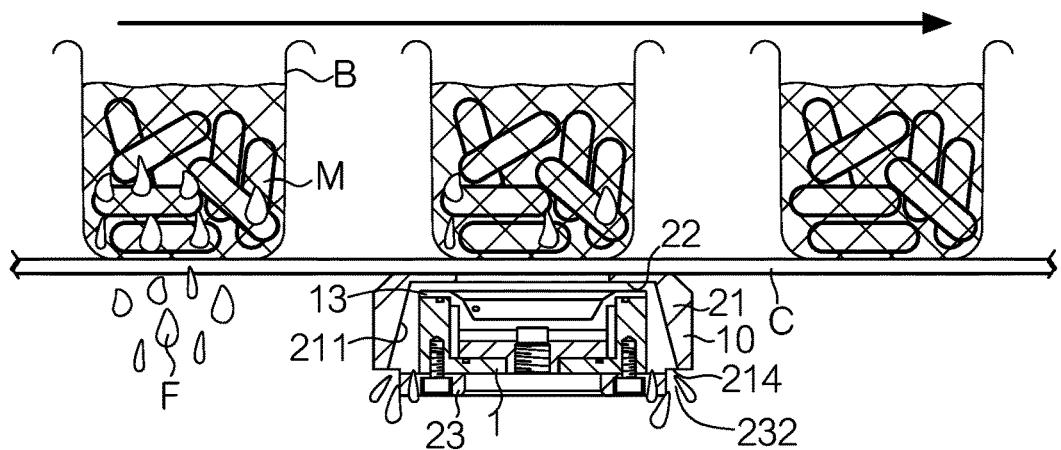
Figure 4:
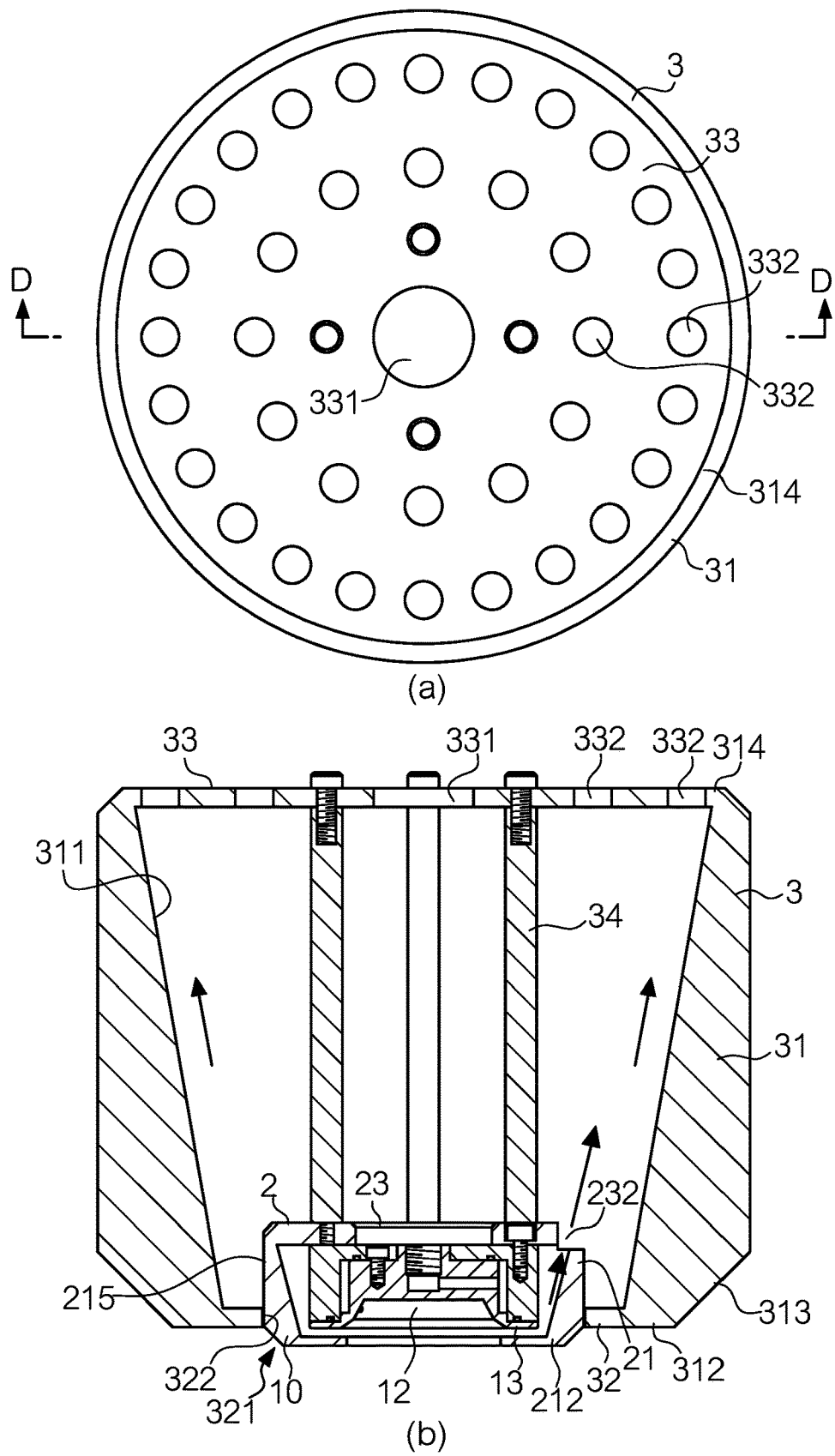
Figure 5:
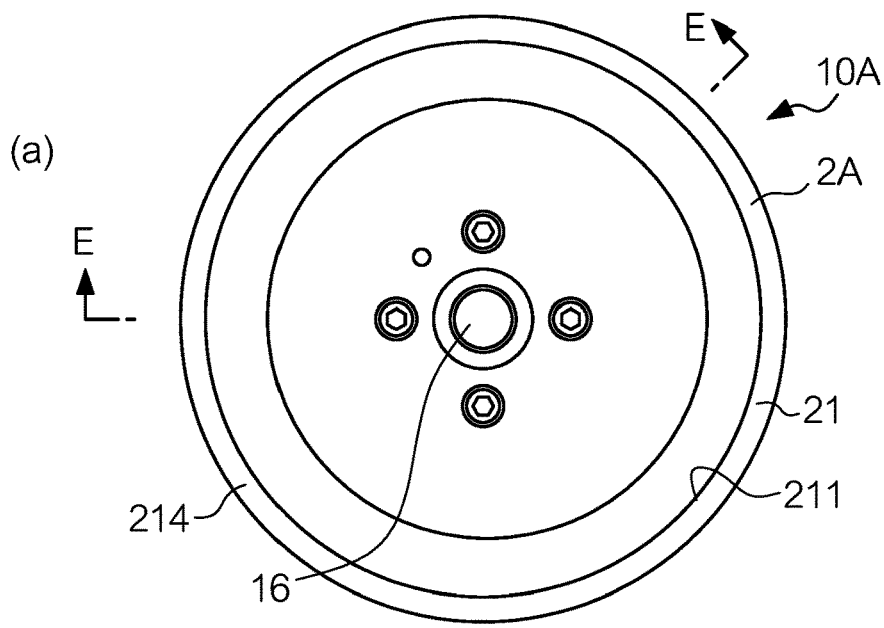
Figure 5:
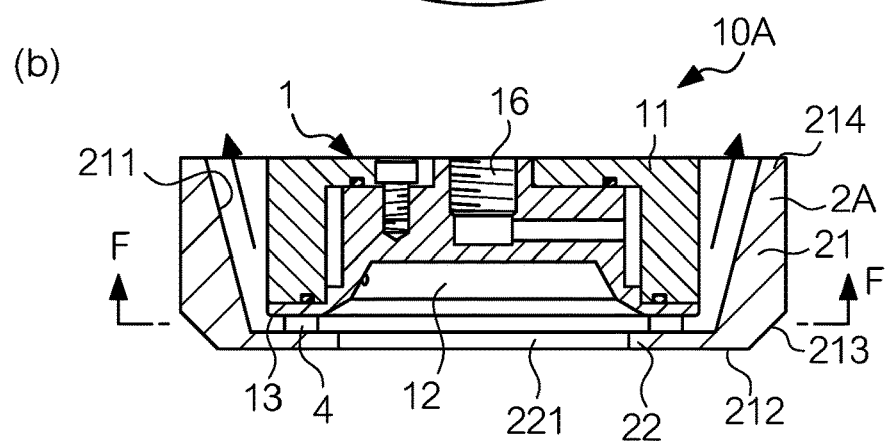
Figure 5:
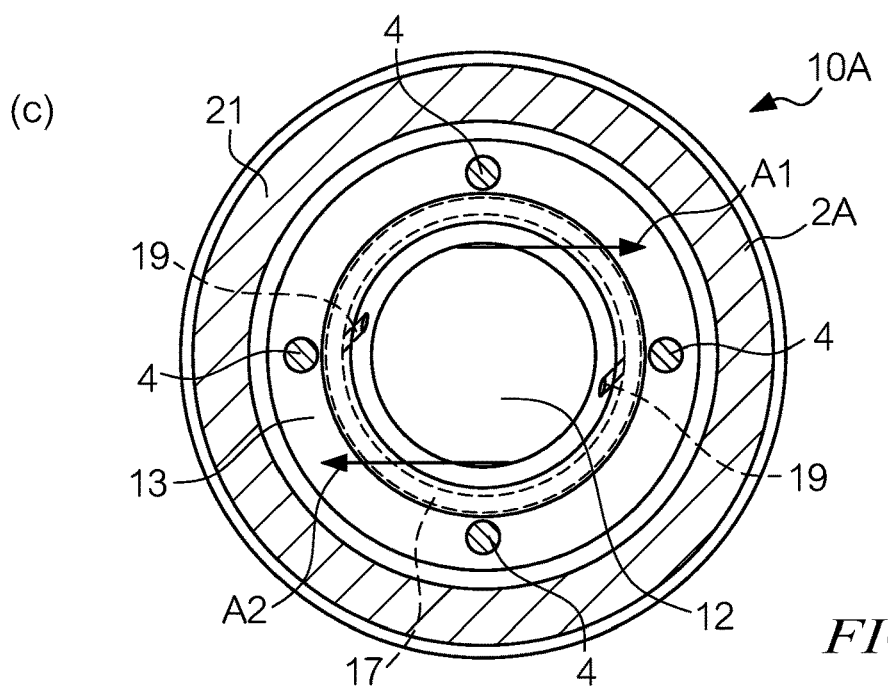
Figure 6:
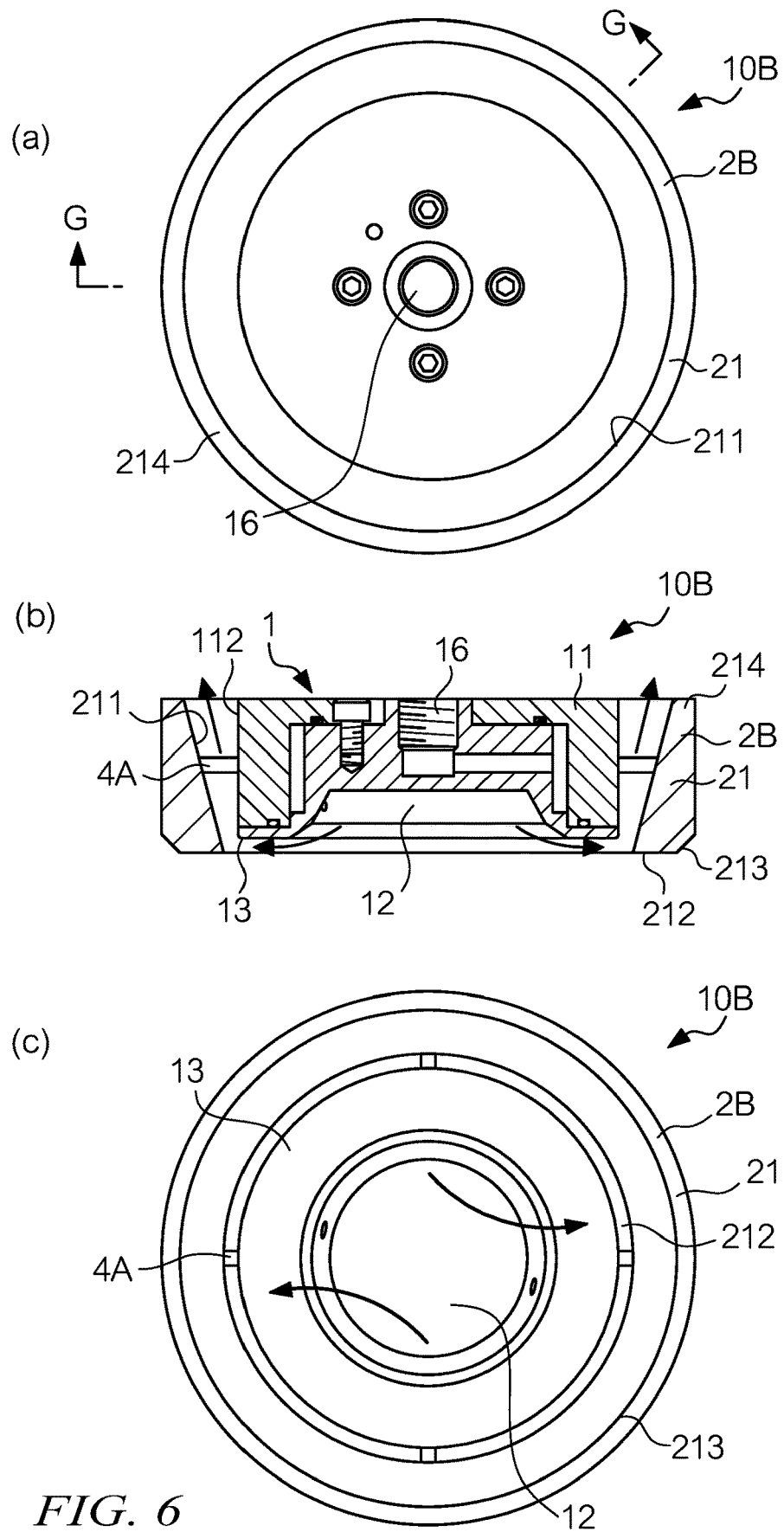
Figure 7:
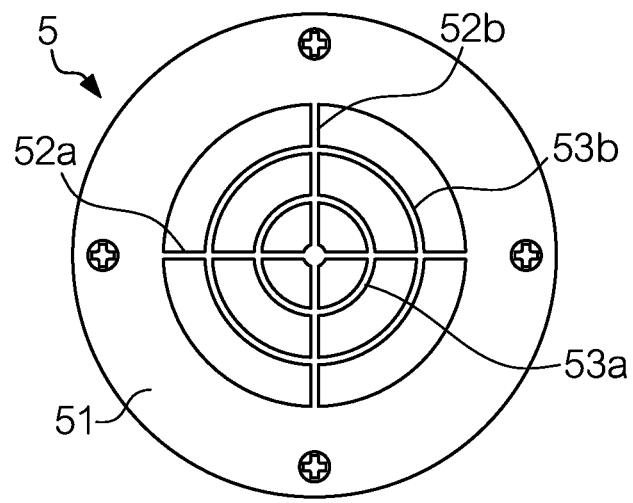
Figure 8:
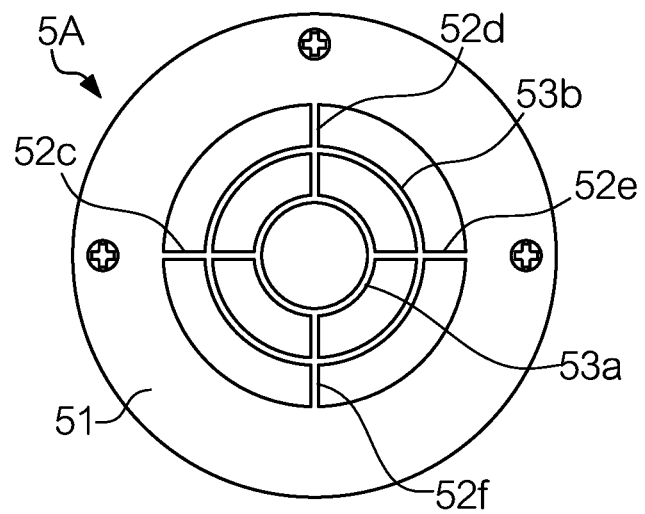
Figure 9:
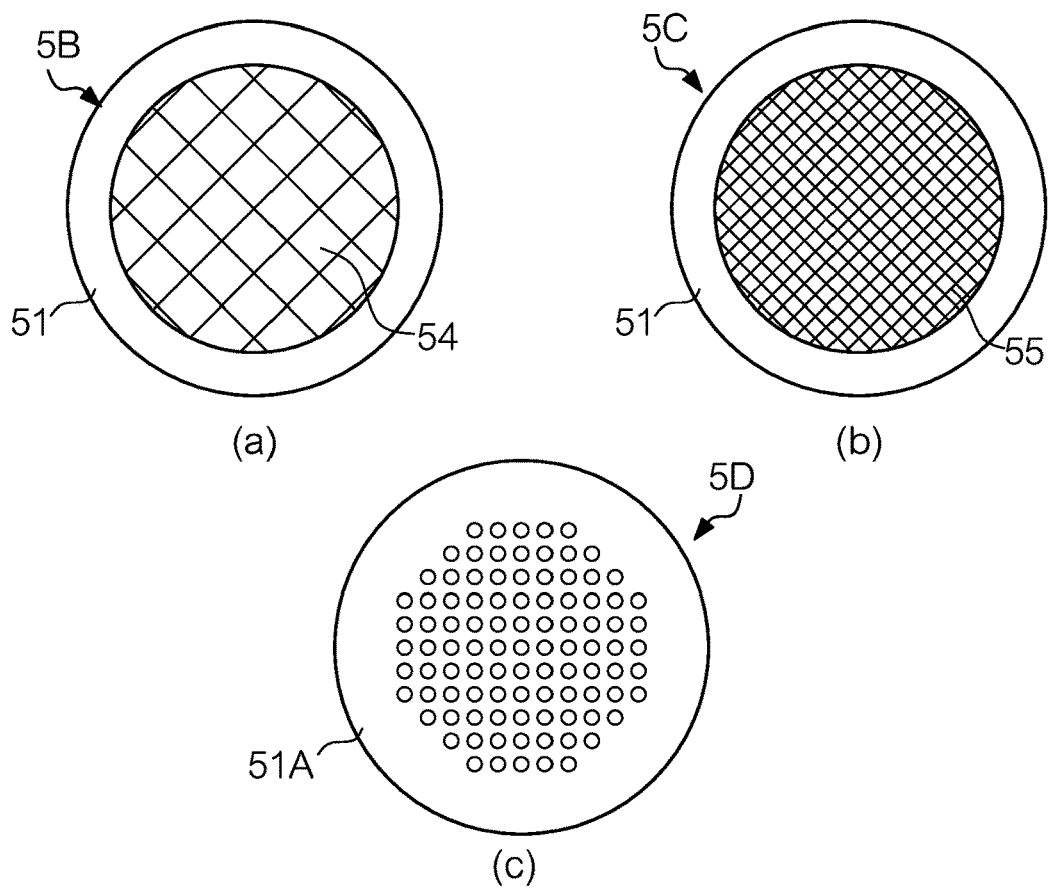
Figure 10:
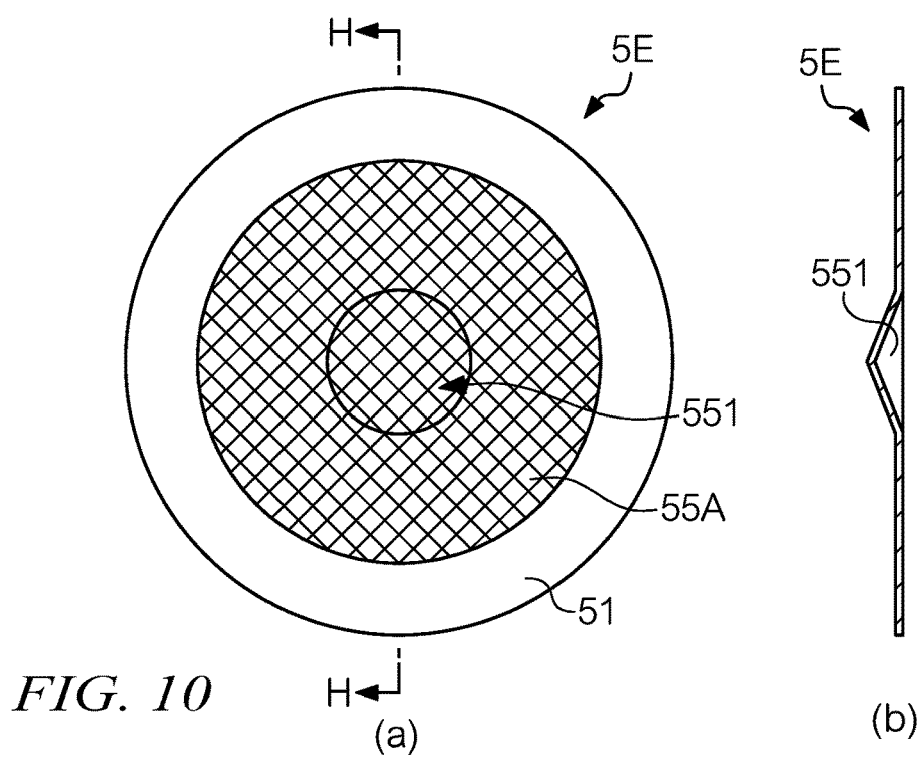
Figure 11:
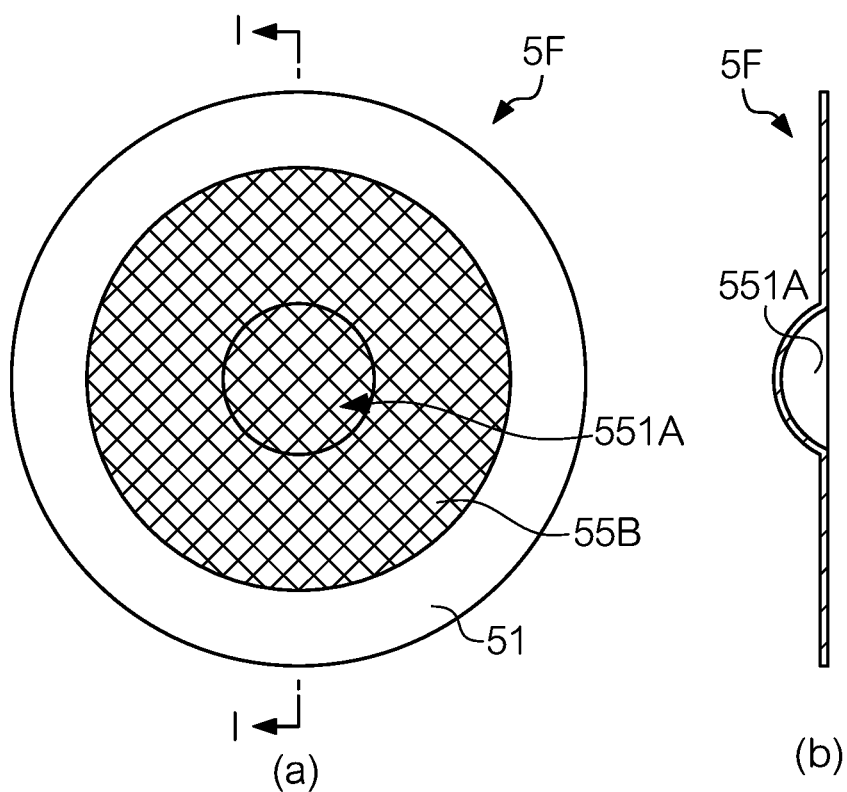
Figure 12:
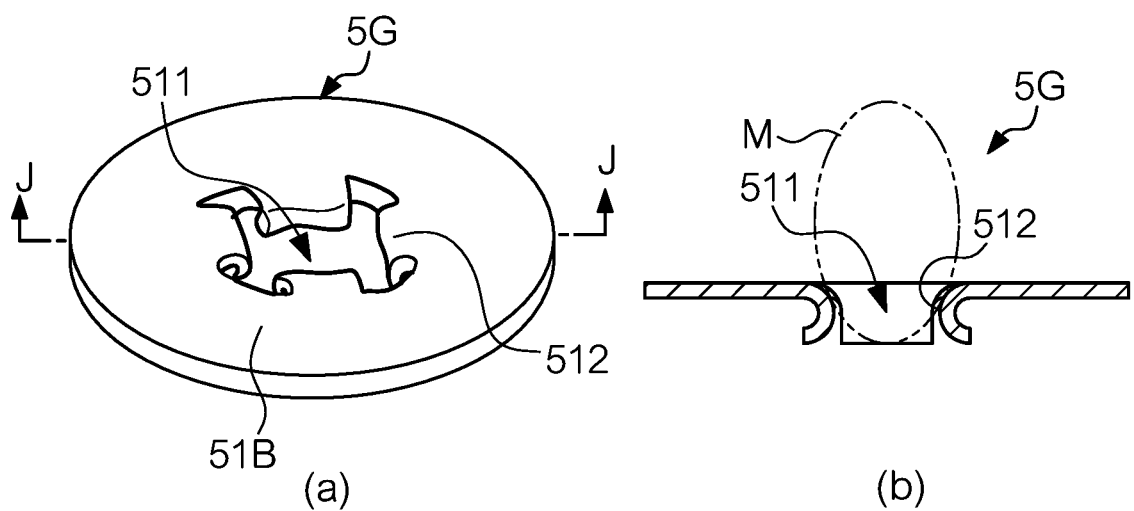
Figure 13:
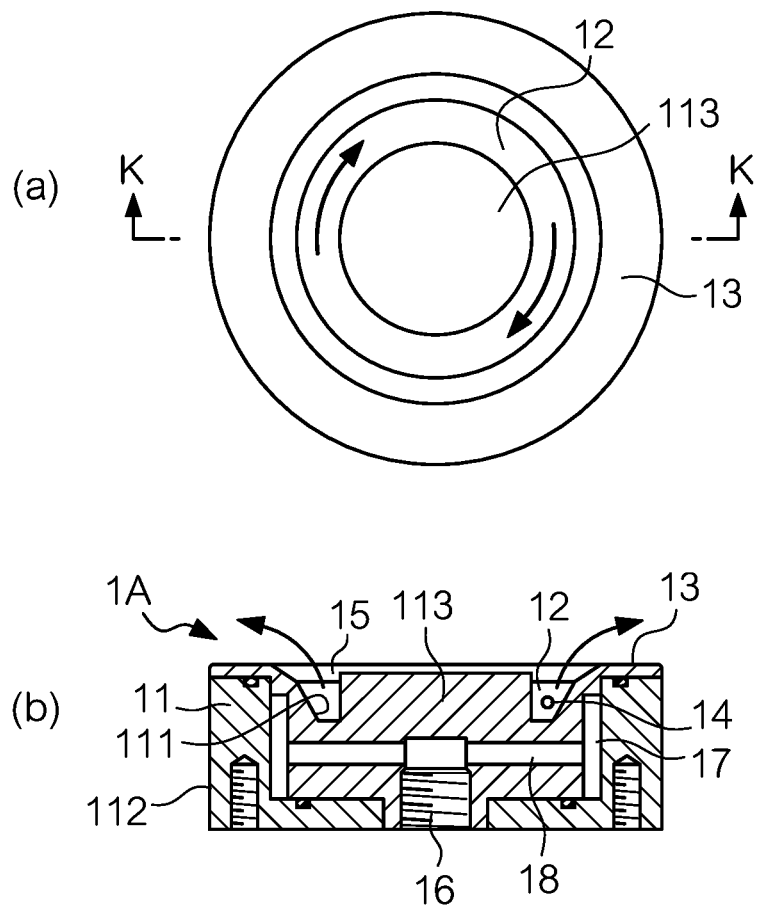
Figure 14:
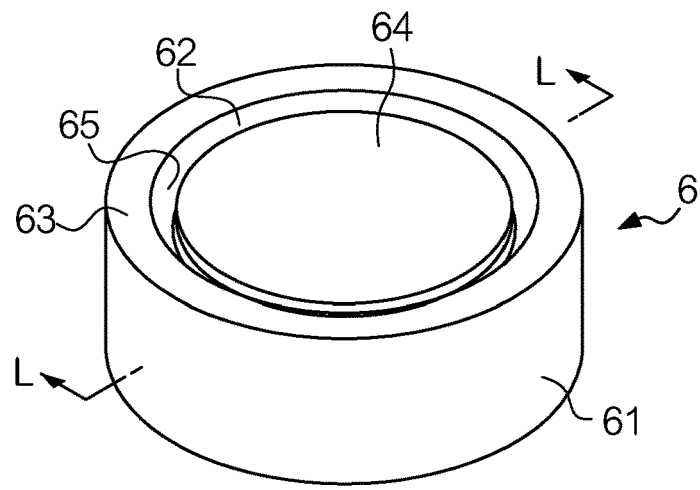
Figure 14:
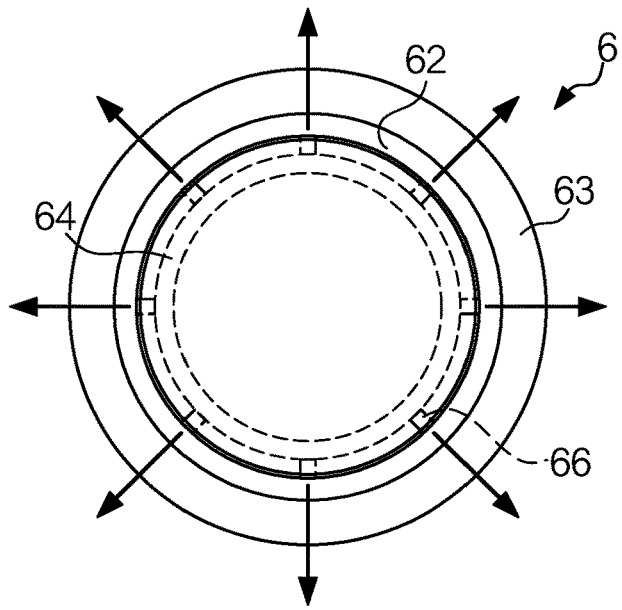
Figure 14:
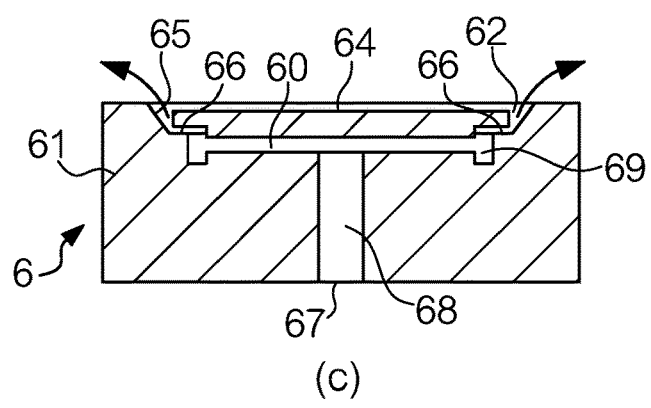

FIG. 1 is a diagram showing an example of a structure of suction device 10.
FIG. 2 is a diagram showing an example of a structure of swirl flow-forming body 1.
FIG. 3 is a diagram showing an example of use of suction device 10.
FIG. 4 is a diagram showing an example of a structure of suction device 10 to which waste receptacle 3 is attached.
FIG. 5 is a diagram showing an example of a structure of suction device 10A not including cover part 23.
FIG. 6 is a diagram showing an example of a structure of suction device 10B not including cover part 23 and flange part 22.
FIG. 7 is a plane view of baffle plate 5.
FIG. 8 is a plane view of baffle plate 5 having another shape.
FIG. 9 is a plane view of baffle plate 5 having another shape.
FIG. 10 is a diagram showing a structure of baffle plate 5 having another shape.
FIG. 11 is a diagram showing a structure of baffle plate 5E including concave part 551 having another shape.
FIG. 12 is a diagram showing a structure of baffle plate 5 having another shape.
FIG. 13 is a diagram showing an example of a structure of swirl flow-forming body 1A including convex part 113 formed in concave part 12,
FIG. 14 is a diagram showing an example of a structure of radial flow-forming body 6.

DESCRIPTION OF REFERENCE NUMERALS

1 . . . swirl flow-forming body, 2 . . . case, 3 . . . waste receptacle, 4 . . . connecting member, 5 . . . baffle plate, 6. . . radial flow-forming body, 10 . . . suction device, 11 . . . main body, 12 . . . concave part, 13 . . . end face, 14 . . . jetting port, 15 . . . inclined surface, 16 . . . supply port, 17 . . . annular passage, 18 . . . communication passage, 19 . . . supply path, 21 . . . guide part, 22 . . . flange part, 23 . . . cover part, 31 . . . guide part, 32 . . . flange part, 33 . . . cover part, 34 . . . support bar, 51 . . . disk part, 52 . . . rod-like member, 53 . . . annular member, 54 . . . mesh part, 55 . . . mesh part, 61 . . . main body, 62 . . . annular concave part, 63 . . . end face, 64 . . . opposing surface, 65 . . . inclined surface, 66 . . . nozzle hole, 67 . . . introduction port, 68 . . . introduction path, 69 . . . annular passage, 70 . . . communication passage, 111 . . . inner-peripheral side surface, 112 . . . outer-peripheral side surface, 113 . . . convex part, 211 . . . inner periphery, 212 . . . opening edge, 213 . . . inclined surface, 214 . . . opening edge, 215 . . . outer-peripheral side surface, 221 . . . opening, 231 . . . hollow, 232 . . . opening, 233 . . . convex part, 234 . . . through hole, 311 . . . inner periphery, 312 . . . opening edge, 313 . . . inclined surface, 314 . . . opening edge, 321 . . . through hole, 322 . . . inner-peripheral side surface, 331 . . . through hole, 332 . . . through hole, 511 . . . opening, 512 . . . regulation part, 551 . . . concave part

MODES FOR IMPLEMENTING THE INVENTION

The mode for carrying out the present invention is described below with reference to the drawings.

1. EMBODIMENT

FIG. 1 is a diagram showing an example of a structure of suction device 10 according to an embodiment of the present invention. FIG. 1(a) is a plane view of suction device 10, FIG. 1(b) is a cross sectional view of FIG. 1(a) along line A-A, FIG. 1(c) is a bottom view of suction device 10. Suction device 10 is equipment for sucking material F from an object to which material F adheres, which object is larger than material F in volume. Material F is, mainly, in the form of liquid or powder, and is, specifically, food. For example, suction device 10 may serve as oil draining equipment for applying suction to excess oil adhering to a fried food such as fried noodles, hot water draining equipment for applying suction to hot water adhering to a boiled food such as boiled noodles, or powder separating equipment for applying suction to excess powder adhering to a powder-coated food. Alternatively, material F is, specifically, dust or trash. Suction device 10 may server as a cleaner for applying suction to dust and trash on a floor.

Suction device 10 includes swirl flow-forming body 1 and case 2. Swirl flow-forming body 1 is equipment for forming a swirl flow to apply suction to material F by use of Bernoulli's principle. Specifically, swirl flow-forming body 1 discharges a fluid into concave part 12 to generate negative pressure within concave part 12, which negative pressure applies suction to material F. The fluid herein refers to a gas such as compressed air, or a liquid such as pure water or carbonated water. Case 2 is a member for housing swirl flow-forming body 1 and for guiding a fluid flowing out of concave part 12 of swirl flow-forming body 1. The material of case 2 is, for example, an aluminum alloy.

FIG. 2 is a diagram showing an example of a structure of swirl flow-forming body 1. FIG. 2(a) is a perspective view of swirl flow-forming body 1, FIG. 2(b) is a cross-sectional view of FIG. 2(a) along line B-B, and FIG. 2(c) is a cross-sectional view of FIG. 2(a) along line C-C. Swirl flow-forming body 1 includes main body 11, concave part 12, end face 13, two jetting ports 14, and inclined surface 15.

Main body 11 has a columnar shape. The material of main body 11 is, for example, an aluminum alloy. End face 13 is formed in a flat shape on one of the surfaces (specifically, the surface that deals with material F) (hereafter referred to as "bottom surface") of main body 11. Concave part 12 has a columnar shape and is formed on end face 13. Concave part 12 is formed on the same axis as main body 11. Inner-peripheral side surface 111 of main body 11, facing concave part 12, is tapered such that the diameter of concave part 12 enlarges toward the opening. Two jetting ports 14 are formed on inner-peripheral side surface 111 that faces concave part 12 of main body 11. The two jetting ports 14 are arranged, for example, in the centre of inner-peripheral side surface 111 in the axial direction, and are arranged so as to be in mutual opposition to each other. Specifically, jetting ports 14 are arranged in point symmetry about the axial centre of the central axis of main body 11 or concave part 12. Fluid supplied to swirl flow-forming body 1 is discharged into concave part 12 via each of jetting ports 14. Inclined surface 15 is formed on the opening end of main body 11.

Swirl flow-forming body 1 also includes supply port 16, annular passage 17, communication passage 18, and two supply paths 19. Supply port 16 has a disk shape and is provided in the centre of the top surface (that is, the surface opposite the bottom surface) of main body 11. Supply port 16 is connected to a fluid supply pump, which is not illustrated, via a tube, for example. Main body 11 is supplied with a fluid therewithin via this supply port 16. Annular passage 17 has a cylindrical shape, and is formed inside main body 11 so as to surround concave part 12. Annular passage 17 is formed on the same axis as concave part 12. Annular passage 17 supplies supply path 19 with fluid supplied from communication passage 18. Communication passage 18 is provided inside main body 11, and extends in the radial direction of the bottom surface or top surface of main body 11 in a straight line. Communication passage 18 communicates, at both ends thereof, with annular passage 17. Communication passage 18 supplies annular passage 17 with the fluid that is supplied into main body 11 via supply port 16. Two supply paths 19 are formed so as to be approximately parallel to end face 13 and to extend in a direction tangential to the outer periphery of concave part 12. Two supply paths 19 extend parallel to each other. Each of supply paths 19 communicates with annular passage 17 at one end thereof, and communicates with jetting port 14 at the other end thereof. Each of supply paths 19 forms a swirl flow of fluid within concave part 12. Each of supply paths 19 is one example of the "fluid flow-forming means" as in the present invention.

Now, case 2, as shown in FIG. 1, includes guide part 21, flange part 22, and cover part 23.

Guide part 21 has a cylindrical shape, and is arranged so as to surround outer-peripheral side surface 112 of main body 11 of swirl flow-forming body 1. In other words, guide part 21 is arranged so as to surround the outer circumference of the opening of concave part 12. Also, guide part 21 is arranged such that its inner periphery 211 does not come into contact with outer-peripheral side surface 112 of main body 11 of swirl flow-forming body 1. Further, guide part 21 is arranged such that one of the opening edges of guide part 21, opening edge 212, projects toward material F relative to end face 13 of swirl flow-forming body 1. The length in the axial direction of guide part 21 is set longer than the length in the axial direction of main body 11 of swirl flow-forming body 1. Opening edge 212 is arranged substantially parallel with end face 13 of swirl flow-forming body 1. Inclined surface 213 is formed on the outer circumference of opening edge 212. Inner periphery 211 of guide part 21 is linearly tapered such that the inner diameter of guide part 21 reduces toward opening edge 212. The rate of taper is, for example, approximately 0.5 percent.

With the structure described in the foregoing, guide part 21 controls flow of a fluid flowing out of concave part 12 of swirl flow-forming body 1 and flowing along end face 13, such that the fluid flows in a direction away from a position of material F (specifically, a position occupied by material F prior to commencement of suction). Guide part 21 controls, especially, flow of a fluid flowing out of concave part 12 and flowing along end face 13, having a radial component, such that the fluid flows in a direction having a component of a direction in which material F is sucked. Specifically, guide part 21 guides a fluid flowing out of concave part 12 of swirl flow-forming body 1, from opening edge 212 to opening edge 214 along inner periphery 211. The fluid flowing out of concave part 12, on colliding with inner periphery 211 of guide part 21, flows toward opening edge 214 between inner periphery 211 and outer-peripheral side surface 112 of main body 11. During this process, the fluid flows along inner periphery 211 in a spiral manner since the fluid flows out of concave part 12 at an angle to the radial direction.

Flange part 22 is an annular member that is formed inwardly at opening edge 212 of guide part 21. Flange part 22 is formed in parallel with end face 13 of swirl flow-forming body 1. The width, or the length in the radial direction, of flange part 22 is set such that flange part 22 covers end face 13, while not covering the bottom of concave part 12. The gap between flange part 22 and end face 13 is set in accordance with the flow amount of fluid supplied from a fluid supply pump to suction device 10. For example, the gap is set such that a fluid flowing out of concave part 12 passes through a flow path formed between flange part 22 and end face 13, without passing through opening 221 of flange part 22. The gap is preferably as small as possible, so as to maintain the suction power of suction device 10.

Cover part 23 is a disk-shaped member that is arranged across opening edge 214 of guide part 21. The outer edge of cover part 23 has four hollows 231 that are formed at regular intervals, so that four openings 232 are formed between cover part 23 and opening edge 214 of guide part 21. A fluid guided by guide part 21 is discharged out of suction device 10 through openings 232. A surface of a substantially rectangular part (convex part 233) of the outer edge of cover part 23, which is sandwiched between hollows 231, is fixed on opening edge 214. Circular through hole 234 is formed at the center of cover part 23, through which hole a tube extending from a fluid supply pump is connected to supply port 16 of swirl flow-forming body 1. Cover part 23 is fixed on the top surface of main body 11 of swirl flow-forming body 1 by, for example, screwing. Screws are inserted in a direction perpendicular to cover part 23 (in other words, in the axial direction of main body 11).

Now, a suction operation of suction device 10 is described below. When swirl flow-forming body 1 is supplied with fluid via supply port 16, the fluid passes through communication passage 18, annular passage 17, and supply paths 19 to be discharged from jetting ports 14 into concave part 12. The fluid discharged into concave part 12 creates a swirl flow within concave part 12, and subsequently flows out of the opening of concave part 12. At this time, if an object to which material F adheres (hereinafter referred to as "material holding object M") is present in a position that opposes opening 221 of flange part 22, inflow of external fluid to concave part 12 is limited, and the density of fluid molecules per unit volume in the centre of the swirl flow becomes reduced due to centrifugal force and entrainment effect of the swirl flow, generating negative pressure within concave part 12. As a result, pressure is applied to material F adhering to material holding object M, so that material F gravitates towards suction device 10. The fluid flowing out of concave part 12 passes through a flow path formed between flange part 22 and end face 13, without passing through opening 221 of flange part 22, so that the fluid collides with inner periphery 211 of guide part 21. After colliding with inner periphery 211, the fluid flows toward opening edge 214 between inner periphery 211 and outer-peripheral side surface 112 of main body 11 to be discharged out of suction device 10 through openings of cover part 23. Material F gravitated toward suction device 10 is discharged, along with the flow of the fluid, out of suction device 10 through openings 232 of cover part 23.

FIG. 3 is a diagram showing an example of use of suction device 10. The drawing shows suction device 10 that serves as oil draining equipment. In the example shown, it is assumed that material F is oil, and material holding object M is a fried food such as fried noodles. Material holding objects M are put in fry basket B and conveyed by mesh conveyer belt C in a direction of the arrow. Suction device 10 is arranged at a fixed position that opposes bottoms of conveyed fry baskets B across conveyer belt C. Suction device 10 is arranged such that concave part 12 opens toward conveyer belt C. The distance between suction device 10 and fry baskets B is preferably as short as possible. When fry basket B is conveyed by conveyer belt C to a position above suction device 10, material holding objects M in fry basket B are subjected to negative pressure generated by suction device 10 so that material holding objects M gravitate toward suction device 10. However, since material holding objects M are larger than the mesh size of fry basket B, only oil droplets adhering to material holding objects M, which are smaller than the mesh size of fry basket B, gravitate toward suction device 10. The oil droplets sucked by swirl flow-forming body 1, along with the flow of a fluid flowing out of concave part 12 of swirl flow-forming body 1, pass through a flow path formed between flange part 22 and end face 13, flow along inner periphery 211 of guide part 21 toward opening edge 214, and finally flow out of suction device 10 through openings 232 of cover part 23.

It is to be noted that, in the example shown in FIG. 3, only one suction device 10 is used; however, plural suction devices 10 may be arranged and used along the conveyance route for fry baskets B. Alternatively, suction device 10 may be caused to move in synchronization with fry basket B.

Suction device 10 described in the foregoing facilitates use of suction force of swirl flow that occurs within swirl flow-forming body 1 in isolation. As such, collision of a fluid flowing out of concave part 12 and material holding object M is controlled, so that undulation of material holding object M is controlled. Also, rotation of material holding object M caused by an outflow fluid is controlled. Also, suction device 10 makes it possible to restrict a direction in which material F is dispersed, to a direction in which material F is sucked (in other words, in the upper direction in FIG. 1(*b*)). As such, as compared with a case in which without use of guide part 21 material F is dispersed in the horizontal direction, dispersal of material F is controlled. Further, since suction device 10 discharges all sucked materials out of suction device 10, material F does not enter concave part 12 or jetting port 14, whereby contamination of a fluid supply path is prevented.

2. MODIFIED EXAMPLES

The embodiment described above may be modified as described below.

Further, the following modified examples may be combined.

2-1. Modified Example 1

Suction device 10 according to the above embodiment may be provided with waste receptacle 3 that is used to house materials to which suction is applied by suction device 10. FIG. 4 is a diagram showing an example of a structure of suction device 10 to which waste receptacle 3 is attached. FIG. 4(a) is a plane view of suction device 10 to which waste receptacle 3 is attached, and FIG. 4(b) is a cross-sectional view of FIG. 4(a) along line D-D. Waste receptacle 3 is a cylindrical container with a bottom at the center of which through hole 321 is formed. Suction device 10 is arranged within through hole 321 of waste receptacle 3 such that concave part 12 opens toward the outside of waste receptacle 3. Waste receptacle 3 includes guide part 31, flange part 32, cover part 33, and support bars 34.

Guide part 31 has a cylindrical shape, and is arranged so as to surround outer-peripheral side surface 215 of guide part 21. In other words, guide part 31 is arranged so as to surround the outer circumference of guide part 21. Also, guide part 31 is arranged such that its inner periphery 311 does not come into contact with outer-peripheral side surface 215 of guide part 21. Further, guide part 31 is arranged such that one of the opening edges of guide part 31, opening edge 312, does not project toward material F relative to opening edge 212 of suction device 10. The length in the axial direction of guide part 31 is set longer than the length in the axial direction of guide part 21 of suction device 10. Opening edge 312 is arranged substantially parallel with end face 13 of swirl flow-forming body 1. Inclined surface 313 is formed on the outer circumference of opening edge 312. Inner periphery 311 of guide part 31 is linearly tapered such that the inner diameter of guide part 31 reduces toward through hole 321. The rate of taper is, for example, approximately 0.35 percent.

With the structure described in the foregoing, guide part 31 controls flow of a fluid flowing out of openings 232 of suction device 10 such that the fluid flows in a direction away from a position of material F (specifically, a position occupied by material F prior to commencement of suction). In other words, guide part 31 guides the fluid in a direction having a component of a direction in which material F is sucked. Specifically, guide part 31 guides a fluid flowing out of openings 232, from opening edge 312 to opening edge 314 along inner periphery 311. The fluid flowing out of openings 232 of suction device 10 flows toward opening edge 314 along inner periphery 311 of guide part 31. During this process, the fluid flows along inner periphery 311 in a spiral manner since the fluid flows out of concave part 12 at an angle to the radial direction.

Flange part 32 is an annular member that is formed inwardly at opening edge 312 of guide part 31. Flange part 32 is formed in parallel with end face 13 of swirl flow-forming body 1. The inner diameter of through hole 321 of flange part 32 is set equal to the outer diameter of guide part 21 of suction device 10. Flange part 32 is arranged such that its inner-peripheral side surface 322 is in contact with outer-peripheral side surface 215 of guide part 21.

Cover part 33 is a disk-shaped member that is fit into opening edge 314 of guide part 31. Circular through hole 331 is formed at the center of cover part 33. Also, two rows of circular through holes 332 are formed around through hole 331 of cover part 33. The size and number of through holes 331 and 332 may be determined in accordance with, for example, a type of material F to which suction is applied by suction device 10. A fluid guided by guide part 31 is discharged out of waste receptacle 3 via through holes 331 and 332. At that time, materials F that are larger than through holes 331 and 332 cannot be discharged from waste receptacle 3, and thus remain in waste receptacle 3. A tube extending from a fluid supply pump is connected to supply port 16 of swirl flow-forming body 1 through one of through holes 331 and 332. Cover part 33 is fixed on the top surface of cover part 23 of suction device 10 via four columnar support bars 34 by, for example, screwing.

Suction device 10 to which waste receptacle 3 is attached, described in the foregoing, may be used as a cleaner. When used as a cleaner, flange part 22 of suction device 10 is brought close to the floor to apply suction to any dust and trash that is present. Alternatively, suction device 10 to which waste receptacle 3 is attached may be used as oil draining equipment, as is the case shown in FIG. 3. In this case, since a direction in which suction device 10 sucks material F conforms to a direction of gravitational force (specifically, suction device 10 is used such that concave part 12 opens toward a direction opposite to a direction of gravitational force), suction device 10 may be provided with air holes that are formed in flange part 32 to discharge a fluid, instead of through holes 331 and 332 formed in cover part 33.

2-2. Modified Example 2

Suction device 10 according the above embodiment may not include cover part 23. FIG. 5 is a diagram showing an example of a structure of suction device 10A that does not include cover part 23. FIG. 5(a) is a plane view of suction device 10A, FIG. 5(b) is a cross-sectional view of FIG. 5(a) along line E-E, and FIG. 5(c) is a cross-sectional view of FIG. 5(b) along line F-F. Suction device 10A differs from suction device 10 in that suction device 10A lacks cover part 23 and instead includes four connecting members 4 that connect case 2A to swirl flow-forming body 1.

Connecting members 4 are columnar spacers that project from end face 13 and extend vertically towards flange part 22. One surface of connecting members 4 is fixed to end face 13, and the other surface is fixed to one surface (specifically, a surface on a side that opposes end face 13) of flange part 22. As such, main body 11 and case 2A are connected via connecting members 4. Connecting member 4 forms, between end face 13 and flange part 22, a flow path for a fluid to flow out of concave part 12. This flow path is formed parallel to end face 13 and flange part 22, and a fluid flowing out of concave part 12 flows along the flow path (that is, flows parallel to end face 13 and the surface of flange part 22) before colliding with inner periphery 211 of guide part 21. A fluid passing through the flow path does not flow out of opening 221 of flange part 22. The height of connecting members 4 (that is, the gap between end face 13 and flange part 22) is set in accordance with the flow amount of fluid supplied from a fluid supply pump to suction device 10A. For example, the height is set such that a fluid flowing out of concave part 12 passes through a flow path formed between end face 13 and flange part 22 by connecting members 4, without passing through opening 221 of flange part 22. The height of connecting members 3 is preferably as low as possible so that the suction power of suction device 10A does not decrease.

It is to be noted that connecting members 4 are preferably arranged in positions so as not to obstruct a flow path formed between end face 13 and flange part 22 by connecting members 4. In other words, connecting members 4 are arranged in positions in which flow paths are not formed (or positions in which flow amount is smaller than in other positions). Specifically, as shown in FIG. 5(c), connecting members 4 are arranged in positions that do not cross the flow path indicated by arrow A1 or A2. This is to prevent turbulent flow from occurring due to collision of a fluid flowing out of concave part 12 and connecting member 4. It is to be noted that a flow path of a fluid flowing out of concave part 12 is determined by the diameter or depth of concave part 12 and flow speed of the fluid. The flow path herein is represented by a synthetic vector of the fluid flowing out of concave part 12, for example.

The shape of connecting members 4 is not limited to a columnar shape, and may be a square pillar shape or an elliptical columnar shape. The number of connecting members 4 is not limited to four, and may be fewer or may be more. Connecting members 4 may be arranged either in an inner side, at the center, or in an outer side in the radial direction of flange part 22.

2-3. Modified Example 3

Suction device 10A according to the above modified example 2 may not include flange part 22. FIG. 6 is a diagram showing an example of a structure of suction device 10B that does not include flange part 22. FIG. 6(a) is a plane view of suction device 10B, FIG. 6(b) is a cross-sectional view of FIG. 6(a) along line G-G and FIG. 6(c) is a bottom view of suction device 10B. Suction device 10B differs from suction device 10A in that suction device 10B lacks flange part 22 and includes four connecting members 4A that connect case 2B to swirl flow-forming body 1, instead of connecting members 4.

Connecting members 4A are columnar spacers that project from outer-peripheral side surface 112 of swirl flow-forming body 1 towards inner periphery 211 of guide part 21. One surface of connecting members 4A is fixed to outer-peripheral side surface 112, and the other surface is fixed to inner periphery 211. As such, main body 11 and case 2B are connected via connecting members 4A. Connecting member 4 forms, between outer-peripheral side surface 112 and inner periphery 211, a flow path for a fluid flowing out of concave part 12 to flow along inner periphery 211.

The shape of connecting members 4A is not limited to a columnar shape, and may be a square pillar shape or an elliptical columnar shape. The number of connecting members 4A is not limited to four, and may be fewer or may be more. Connecting members 4A may be arranged in an upper side, at the center, or in a lower side in the axial direction of guide part 21.

2-4. Modified Example 4

Suction device 10 according to the above embodiment may be provided with baffle plate 5 to prevent material holding object M from being sucked into concave part 12. FIG. 7 is a plane view of baffle plate 5.

Baffle plate 5 is a resin flat plate having a disk shape, which includes a disk part 51 having a disk-shaped opening, a plurality of rod-like members 52a and 52b (hereafter collectively referred to as "rod-like member 52") that stretch over the opening of disk part 51, and a plurality of annular members 53a and 53b (hereafter collectively referred to as "annular member 53") that stretch between rod-like members 52a and 52b. Baffle plate 5 is attached to a surface (specifically, a surface on a side that opposes end face 13) of flange part 22 such that baffle plate 5 has the same centre as and is parallel to flange part 22. Baffle plate 5 is attached to flange part 22 by screwing, for example. One surface of disk part 21 of baffle plate 5 attached to case 2 opposes flange part 22. Rod-like members 52a and 52b extend so as to intersect in the centre of the opening of disk part 51. Rod-like members 52a and 52b of baffle plate 5 attached to case 2 extend across opening 221 of flange part 22. Rod-like members 52a and 52b extend so as to form a cross, for example. Annular members 53a and 53b form concentric circles whose centre is the point at which rod-like members 52a and 52b cross. A gap is provided between the innermost annular member 53a and the intersection of rod-like members 52a and 52b. That is, annular member 53a is provided so as not to cover the central part of opening 221 of flange part 22 when baffle plate 5 is attached to case 2. Therefore, annular member 53a does not obstruct the inflow of fluid that is sucked into concave part 12.

It is to be noted that the shape of baffle plate 5 is not limited to the shape shown in FIG. 7. FIG. 8 is a plane view of baffle plate 5 having another shape. Baffle plate 5A shown in the drawing differs from baffle plate 5 in that rod-like members 52a and 52b are cut out in the region inside annular member 53a arranged on the innermost side of baffle plate 5A. Baffle plate 5A includes disk part 51, rod-like members 52c, 52d, 52e and 52f, and annular members 53a and 53b. Rod-like members 52c, 52d, 52e and 52f are the same length, each extending from the edge of the opening of disk part 51 towards the centre of the opening thereof. Each of rod-like members 52c, 52d, 52e and 52f extends perpendicularly with respect to adjacent rod-like members. Annular member 53a is arranged such that the outer-peripheral edge thereof comes into contact with the tip of each of rod-like members 52c, 52d, 52e and 52f. Annular member 53b extends between each of the rod-like members 52c, 52d, 52e and 52f so as to be concentric with annular member 53a.

FIG. 9 is a plane view of baffle plate 5 having another shape. Baffle plate 5B shown in FIG. 9(a) includes circular loosely woven mesh part 54 on the opening of disk part 51. Mesh part 54 of baffle plate 5B attached to case 2 covers opening 221 of flange part 22. Baffle plate 5C shown in FIG. 9(b) includes circular tightly woven mesh part 55 on the opening of disk part 51. Mesh part 55 of baffle plate 5C attached to case 2 covers opening 221 of flange part 22. Baffle plate 5D shown in FIG. 9(c) includes disk part 51A having a plurality of round holes in the centre thereof in place of disk part 51. In baffle plate 5B, a porous material may be adopted in place of mesh part 54.

FIG. 10 is a diagram showing a structure of baffle plate 5 having a different shape. FIG. 10(a) is a plane view of baffle plate 5E, and FIG. 10(b) is a cross-sectional view of FIG. 10(a) along line H-H. Baffle plate 5E includes a circular tightly woven mesh part 55A on the opening of disk part 51. This mesh part 55A includes a conical concave part 551 in the centre thereof. Baffle plate 5E is attached to case 2 such that concave part 551 is recessed on opening 221 of flange part 22. When a part or the entirety of material holding object M enters or sinks into concave part 551, movement of material holding object M becomes regulated by the inclined surface of mesh part 55A that forms concave part 551, so that the position of material holding object M is determined.

Since the bottom of concave part 551 is closer to concave part 12 of swirl flow-forming body 1 than other parts of mesh part 55A, the part of material holding object M that has entered or sunk into concave part 551 has suction applied to it more forcefully than other parts. The diameter or depth of concave part 551 is determined in accordance with the shape and size of material holding object M.

The shape of concave part 551 may also be determined in accordance with the shape of material holding object M. FIG. 11 is a diagram showing a structure of baffle plate 5E having concave part 551 with a different shape. FIG. 11(a) is a plane view of baffle plate 5F, and FIG. 11(b) is a cross-sectional view of FIG. 11(a) along line I-I. Baffle plate 5F includes a circular tightly woven mesh part 55B on the opening of disk part 51, which mesh part includes hemispherical concave part 551A in the centre thereof. Alternatively, the shape of concave part 551 may be groove-like so that arrangement of the direction of thin and long material holding object M may be made possible.

FIG. 12 is a diagram showing a structure of baffle plate 5 having a different shape. FIG. 12(a) is a perspective view of baffle plate 5G, and FIG. 12(b) is a cross-sectional view of FIG. 12(a) along line J-J. Baffle plate 5G includes a disk part 51B that includes opening 511 in the centre thereof in place of disk part 51. Opening 511 is a through hole. Disk part 51B includes four regulation parts 512 at the opening end thereof. Regulation part 512 is formed by subjecting the opening end of disk part 51B to radius bending, for example. Regulation part 512 has an elasticity similar to that of a spring. Baffle plate 5G is attached to case 2 such that regulation part 512 projects to the opening 221 side of flange part 22. When a part of material holding object M enters or sinks into opening 511 of baffle plate 5G, movement of material holding object M (movement in the horizontal and vertical directions with respect to baffle plate 5G) becomes regulated by regulation part 512 that surrounds opening 511, so that the position of material holding object M is determined. At this time, the part that has entered or sunk into opening 511 is closer to concave part 12 of swirl flow-forming body 1 than other parts; accordingly, suction is applied to the part with more force. It is to be noted that, in the present modified example, as illustrated by the broken line in FIG. 12(b), material holding object M is assumed to be spherical or ellipsoid. The shape and size of opening 511 is determined in accordance with the shape and size of material holding object M.

2-5. Modified Example 5

Swirl flow-forming body 1 according to the above embodiment may be provided with convex part 113 that is formed within concave part 12. FIG. 13 is a diagram showing an example of a structure of swirl flow-forming body 1A that includes convex part 113 formed within concave part 12. FIG. 13(a) is a bottom view of swirl flow-forming body 1A, and FIG. 13(b) is a cross-sectional view of FIG. 13(a) along line K-K. Convex part 113 has a columnar shape, and is formed so as to extend from the bottom of concave part 12. Convex part 113 is formed on the same axis as main body 11 or concave part 12. The top surface of convex part 113 (specifically, a surface that opposes material F) is formed so as to be concave with respect to end face 13. Convex part 113 forms a fluid flow path between the outer-peripheral side surface thereof and inner-peripheral side surface 111 of main body 11, and fluid discharged into concave part 12 forms a swirl flow by flowing through this fluid flow path. It is to be noted that the top surface of convex part 113 may be formed on the same plane as end face 13. Also, the end part of the top surface of convex part 113 may be chamfered.

2-6. Modified Example 6

In suction device 10 according to the above embodiment, a radial flow-forming body that forms a radial flow may be adopted in place of swirl flow-forming body 1. FIG. 14 is a diagram showing an example of a structure of radial flow-forming body 6. FIG. 14(a) is a perspective view of radial flow-forming body 6, FIG. 14(b) is a bottom view of radial flow-forming body 6, and FIG. 14(c) is a cross-sectional view of FIG. 14(b) along line L-L. Radial flow-forming body 6 is equipment that discharges fluid to generate negative pressure between radial flow-forming body 6 and material F, which negative pressure applies suction to material F.

Radial flow-forming body 6 includes main body 61, annular concave part 62, end face 63, opposing surface 64, and inclined surface 65. Main body 61 has a columnar shape. End face 63 is formed in a flat shape on one of the surfaces of main body 61 (specifically, a surface that faces material F) (hereafter referred to as "bottom surface"). Annular concave part 62 is formed on end face 63. Annular concave part 62 is formed in a circle concentric with the outer periphery of main body 61. Opposing surface 64 is formed in a flat shape on the bottom surface of main body 61. Opposing surface 64 is surrounded by annular concave part 62 and opposes material F. Opposing surface 64 is formed on the bottom surface of main body 61 so as to be concave with respect to end face 63. Inclined surface 65 is formed at the opening of annular concave part 62 (specifically, the outer-peripheral edge thereof).

Radial flow-forming body 6 further includes six nozzle holes 66, introduction port 67, introduction path 68, annular passage 69, and communication passage 70. Introduction port 67 is circular and is provided in the centre of the top surface of main body 61 (that is, a surface opposite the bottom surface). Introduction port 67 is connected to a fluid supply pump, which is not illustrated, via a tube, for example. Introduction path 68 is provided inside main body 61, and extends in a straight line along the central axis of main body 61. Introduction path 68 communicates with introduction port 67 at one end thereof, and communicates with communication passage 70 at the other end thereof. Introduction path 68 supplies communication passage 70 with fluid that is supplied into main body 61 via introduction port 67. Communication passage 70 is provided inside main body 61, and extends in a straight line in the radial direction of annular passage 69. Communication passage 70 communicates with introduction path 68 at the central part thereof in the axial direction, and communicates with annular passage 69 at both ends thereof. Communication passage 70 supplies annular passage 69 with fluid that is supplied from introduction path 68. Annular passage 69 is cylindrical, and is provided inside main body 61. Annular passage 69 is formed on the same axis as main body 61. Annular passage 69 supplies nozzle holes 66 with fluid that is supplied from communication passage 70. Each of the six nozzle holes 66 is formed so as to be approximately parallel to end face 63 or opposing surface 64 and extend in a straight line in the radial direction of the bottom surface or top surface of main body 61, one end thereof communicating with annular passage 69 and the other end communicating with annular concave part 62. The six nozzle holes 66 are arranged on the same plane so that lines extending radially from the center of radial flow-forming body 6 through adjacent nozzle holes 66 form an approximately 45 degree angle with each other. Each of nozzle holes 66 discharges fluid such as a gas into annular concave part 62 to form a radial flow. Each of nozzle holes 66 is one example of the "fluid flow-forming means" in the present invention.

When radial flow-forming body 6 described in the foregoing is supplied with fluid via introduction port 67, the fluid passes through introduction path 68, communication passage 70 and annular passage 69 before being discharged from nozzle holes 66 into annular concave part 62. The fluid discharged into annular concave part 62 flows out of the opening of annular concave part 62. At this time, if material holding object M is present opposite opening 221 of flange part 22, inflow of external fluid to the space between opposing surface 64 and material holding object M is limited, and the density of fluid molecules per unit volume in the space becomes reduced due to the entrainment effect of the radial flow, generating negative pressure. As a result, pressure is applied to material F adhering to material holding object M by surrounding fluid, so that material F gravitates towards radial flow-forming body 6.

The structure of radial flow-forming body 6 (in particular, the number of nozzle holes 66 and structure of the fluid flow path within main body 61) is not limited to the structure shown in FIG. 14. The structure may be determined in accordance with the size, shape and quality of material F to which suction is applied by radial flow-forming body 6.

2-7. Modified Example 7

In suction device 10 according to the above embodiment, a well-known electric fan may be adopted in place of swirl flow-forming body 1 (for example, refer to published unexamined patent application number 2011-138948). Specifically, a configuration may be adopted in which an intake port is provided in main body 11 of swirl flow-forming body 1, and a fan that rotates to apply suction to gas from the intake port into concave part 12 and to generate a swirl flow within concave part 12 is provided inside concave part 12. This fan is one example of the "fluid flow-forming means" in the present invention.

2-8. Modified Example 8

The shape of main body 11 of swirl flow-forming body 1 as in the embodiment described above is not limited to being columnar, and may be a square or elliptical columnar shape. The number of supply paths 19 provided in swirl flow-forming body 1 is not limited to two, and may be fewer or may be more. Inclined surface 15 may not necessarily be provided (that is, the end part of end face 13 may not necessarily be chamfered).

2-9. Modified Example 9

Guide part 21 of case 2 according to the above embodiment is not necessarily made of a cylindrical member, and may be made of plural plate-like members that are annually arranged. The shape of guide part 21 is not limited to a circular cylindrical shape, and may be a rectangular or elliptical cylindrical shape. The taper formed in inner periphery 211 of guide part 21 is not limited to a linear taper, and may be an exponential or parabolic taper. Alternatively, the taper may be made of small steps. Inner periphery 211 of guide part 21 may be tapered such that the inner diameter of guide part 21 enlarges toward opening edge 212, in contrast to the above embodiment. The taper may be omitted. The shape of flange part 22 is not limited to a circular ring shape, and may be a rectangular or elliptical ring shape. The shape of cover part 23 is not limited to a disk shape, and may be a rectangular or elliptical shape.

2-10. Modified Example 10

The shape of guide part 31 of waste receptacle 3 according to modified example 3 is not limited to a circular cylindrical shape, and may be a rectangular or elliptical cylindrical shape. The taper formed in inner periphery 311 of guide part 31 is not limited to a linear taper, and may be an exponential or parabolic taper. Alternatively, the taper may be made of small steps. Inner periphery 311 of guide part 31 may be tapered such that the inner diameter of guide part 31 enlarges toward through hole 321, in contrast to modified example 1. The taper may be omitted. The shape of flange part 32 is not limited to a circular ring shape, and may be a rectangular or elliptical ring shape. The shape of cover part 33 is not limited to a disk shape, and may be a rectangular or elliptical shape.

2-11. Modified Example 11

Suction device 10 according to the above embodiment may be used to apply suction to and convey a plate-like member such as a semiconductor wafer or a glass substrate.

The invention claimed is:

1. A suction device, comprising:
   a columnar main body;
   a flat end face formed on the main body;
   a concave part formed at the end face;
   a fluid flow-forming means for forming a fluid swirl flow in the concave part or forming a radial flow by discharging a fluid into the concave part, the fluid swirl flow or the radial flow generating negative pressure that applies suction to a material; and
   a guide part that surrounds the concave part, and controls flow of the fluid flowing out of the concave part and flowing along the end face, such that the fluid flows in a direction away from a position occupied by the material prior to a commencement of suction, the guide part including a flange part that projects radially inward and, as seen in an axial direction of the guide part, overlaps the end face.

2. The suction device according to claim 1, wherein the guide part is a cylindrical member that is arranged such that an opening edge of the cylindrical member projects toward the material relative to the end face.

3. The suction device according to claim 2, wherein the flange part is at the opening edge.

4. The suction device according to claim 2, wherein:
   an inner periphery of the guide part is tapered such that an inner diameter of the guide part reduces toward the opening edge; and
   the guide part guides the fluid flowing out of the concave part along the inner periphery.

5. The suction device according to claim 2, wherein:
   the guide part comprises a plate that extends across another opening edge of the guide part; and
   the plate is fixed on a surface opposite to the end face of the main body.

6. The suction device according to claim 1, wherein the guide part comprises a plurality of members.

7. The suction device according to claim 1, further comprising a cylindrical container that surrounds an outer circumference of the guide part, the container comprising a bottom with a through hole, wherein the main body is arranged within the through hole such that the concave part opens away from the inside of the container.

8. The suction device according to claim 7, wherein an inner periphery of the container is tapered such that an inner diameter of the container reduces toward the through hole.

9. The suction device according to claim 1, wherein the material is food.

* * * * *